(12) United States Patent
Hongoh et al.

(10) Patent No.: US 7,038,606 B2
(45) Date of Patent: May 2, 2006

(54) DIGITAL SIGNAL PROCESSING DEVICE AND AUDIO SIGNAL REPRODUCTION DEVICE

(75) Inventors: Tsunehiko Hongoh, Higashihiroshima (JP); Hirotoshi Yamamoto, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/507,832

(22) PCT Filed: Oct. 23, 2003

(86) PCT No.: PCT/JP03/13583

§ 371 (c)(1),
(2), (4) Date: Sep. 15, 2004

(87) PCT Pub. No.: WO2004/040770

PCT Pub. Date: May 13, 2004

(65) Prior Publication Data

US 2005/0122244 A1    Jun. 9, 2005

(30) Foreign Application Priority Data

Oct. 29, 2002 (JP) .............................. 2002-313802
Jun. 25, 2003 (JP) .............................. 2003-181023

(51) Int. Cl.
*H03M 3/00* (2006.01)

(52) U.S. Cl. ....................... 341/143; 341/144; 341/152

(58) Field of Classification Search ................ 341/143, 341/144, 152, 118
See application file for complete search history.

(56) References Cited

U.S. PATENT DOCUMENTS

| 5,278,559 | A  | * | 1/1994 | Yazawa ...................... 341/143 |
| 5,420,892 | A  | * | 5/1995 | Okamoto .................... 341/143 |
| 5,877,716 | A  | * | 3/1999 | Tagami ....................... 341/143 |
| 6,175,322 | B1 | * | 1/2001 | Eastty et al. ................ 341/143 |
| 6,249,238 | B1 | * | 6/2001 | Steinlechner ............... 341/143 |
| 6,295,014 | B1 | * | 9/2001 | Eastty et al. ................ 341/143 |
| 6,515,601 | B1 | * | 2/2003 | Fukuhara et al. ........... 341/143 |

FOREIGN PATENT DOCUMENTS

JP          5-67976  A     3/1993

(Continued)

OTHER PUBLICATIONS

"Multiplierless Realization of All Pole Digital Filters", Saramaki et al., Institute of Signal Processing, Tampere University of Technology, 2002 6th International Conference, Aug. 26-30, 2002, vol. 1, Aug. 26, 2002, pp. 1-4.

(Continued)

*Primary Examiner*—John Nguyen
*Assistant Examiner*—Lam T. Mai
(74) *Attorney, Agent, or Firm*—Birch, Stewart, Kolasch & Birch, LLP (57) ABSTRACT

An audio signal reproduction device of the invention has a seventh-order delta-sigma modulation circuit that receives a PCM signal and that performs delta-sigma modulation on the PCM signal, a PWM circuit that performs pulse width modulation on the signal outputted from the seventh-order delta-sigma modulation circuit to produce a one-bit digital signal, a switching amplifier that converts the one-bit digital signal into an analog signal and that then amplifies it, and a low-pass filter that eliminates high-frequency components of the analog signal. This configuration permits size and weight reduction.

13 Claims, 6 Drawing Sheets

FOREIGN PATENT DOCUMENTS

| | | |
|---|---|---|
| JP | 5-145423 A | 6/1993 |
| JP | 5-235773 A | 9/1993 |
| JP | 7-22952 A | 1/1995 |
| JP | 10-322215 A | 12/1998 |
| JP | 3226660 B2 | 8/2001 |

OTHER PUBLICATIONS

"A Flexible Repetitive CSD Code Filter Processor Unit in CMOS", Hentschke et al., IPM—University of Kassel, ASIC Conference and Exhibit, 1994, Proceedings, Seventh Annual IEEE International, Rochester, NY, Sep. 19-23, 1994, pp. 261-264.

"Digital Bandlimiting Filters for P.C.M. Transmission Systems", Tattersall et al., IEEE Transactions on Communications USA. vol. COM-27, No. 1, Jan., 1979, pp. 240-246.

"A Single-Chip Frequency-Shift Keyed Modem Implemented Using Digital Signal Processing", Apfel et al., IEEE Journal of Solid-State Circuits, IEEE Inc., New York, USA, vol. SC-19, No. 6, Dec., 1984, pp. 869-877.

* cited by examiner

DIGITAL SIGNAL PROCESSING DEVICE AND AUDIO SIGNAL REPRODUCTION DEVICE

This application is 371 of PCT/JP03/13583 Oct. 23, 2003.

1. Technical Field

The present invention relates to a audio signal reproduction device. More particularly, the present invention relates to an audio signal reproduction device incorporating a delta-sigma modulation circuit. The present invention also relates to a digital signal processing device.

2. Background Art

Audio signal reproduction devices that are used to reproduce an audio signal stored in a recording medium such as a CD or MD are classified into those adopting a multiple-bit PCM (pulse code modulation) system and those adopting a one-bit system. The one-bit system can reproduce a sound source with higher fidelity than the multiple-bit PCM system can.

A conventional one-bit audio signal reproduction device first encodes an audio signal, which is in the form of a multiple-bit digital signal, into a one-bit digital signal. It then digitally amplifies the one-bit digital signal, and then, by using a low-pass filter, converts the digitally amplified one-bit digital signal into a reproduced signal, which is in the form of an analog signal (for example, see Japanese Patent Application Laid-Open No. H10-322215).

Now, an example of the configuration of a PDM (pulse density modulation) signal generation circuit incorporated in a conventional one-bit audio signal reproduction device will be described with reference to FIG. 5.

Figure 5:
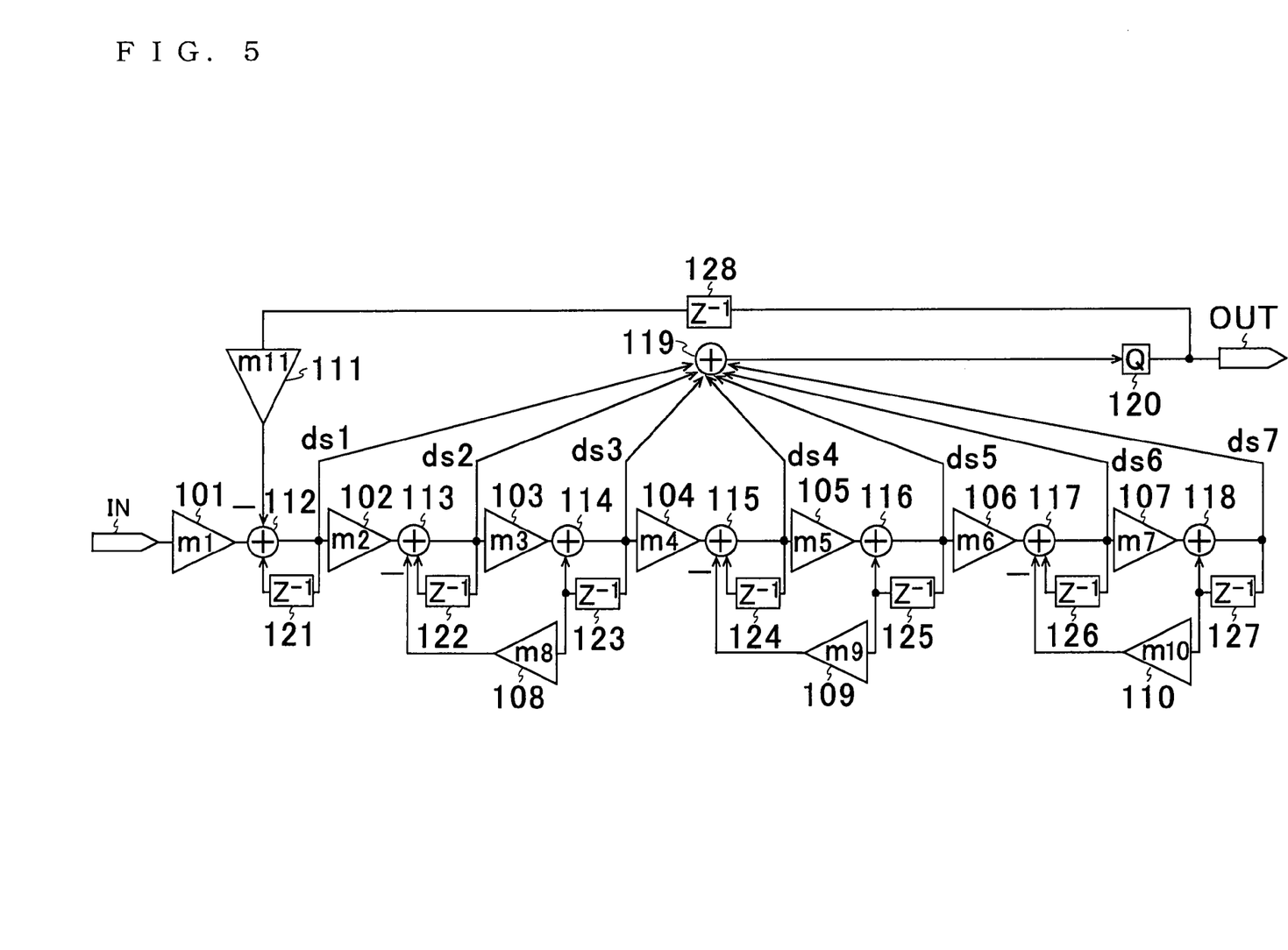
FIG. 5 is a diagram showing an example of the configuration of the PDM signal generation circuit provided in a conventional one-bit audio signal reproduction device.

The PDM signal generation circuit shown in FIG. 5 is composed of an input terminal IN, an output terminal OUT, multipliers 101 to 111, adders 112 to 119, a quantizer 120, and delay elements 121 to 128. The multiplication factors of the multipliers 101, 102, . . . , and 111 are m1, m2, . . . , and m11, respectively.

The PDM signal generation circuit shown in FIG. 5 performs seventh-order delta-signal modulation on an audio signal, which is a multiple-bit digital signal, to produce a PDM signal, which is a one-bit digital signal. The PDM signal consists of pluses of fixed amplitude and fixed pulse width, and represents the level of a signal by varying the density, i.e., occurrence rate, of those pulses.

Moreover, to reproduce a sound source with fidelity, the PDM signal generation circuit shown in FIG. 5 processes data at a very high sampling frequency of 2.8 MHz or 5.6 MHz throughout, i.e., from the input terminal IN to the output terminal OUT.

When a one-bit digital signal is produced by delta-sigma modulation, quantization error components exhibit a distribution shifted to a higher range. This is known as "noise shaping". Accordingly, the PDM signal generation circuit shown in FIG. 5 is used to reduce quantization noise in a frequency range of interest (for example, the audible frequency range), and thus functions as an IIR (infinite-duration impulse response) filter. This helps obtain a desired S/N ratio in the frequency range of interest and achieve wider-range coverage.

However, the PDM signal generation circuit shown in FIG. 5 operates at a very high sampling frequency (for example, 2.8 MHz, 5.6 MHz, or the like), and thus exerts an undesirable influence due to unnecessary electromagnetic radiation. This makes it essential to lay sufficient shielding against noise as by laying double shielding using a steel plate and a copper plate. As a result, in an audio signal reproduction device, the steel plate and other components for shielding occupy a considerable space and increase the weight of the audio signal reproduction device. This makes it unfeasible to reduce the size and weight of audio signal reproduction devices.

Moreover, the PDM signal generation circuit shown in FIG. 5 incorporates many multipliers and adders, and thus has a large circuit scale. The large circuit scale requires accordingly high power consumption. Furthermore, the PDM signal generation circuit shown in FIG. 5 is typically built as an analog circuit, and can only handle signal processing for a single channel. Accordingly, in stereophonic applications (involving left and right channels), it is necessary to use two of the PDM signal generation circuit shown in FIG. 5. As described above, the PDM signal generation circuit has a complicated circuit configuration and a large circuit scale, and is therefore difficult to mount on a conventional LSI. This makes it unfeasible to reduce the size and weight of audio signal reproduction devices.

Having the disadvantages described above, the PDM signal generation circuit shown in FIG. 5 is unsuitable particularly for use in portable audio signal reproduction devices, in which low power consumption, compactness and light weight, and low cost are eagerly sought, and are accordingly not adopted in such applications.

DISCLOSURE OF THE INVENTION

In view of the conventionally encountered inconveniences described above, it is an object of the present invention to provide a one-bit audio signal reproduction device that permits size and weight reduction. It is another object of the present invention to provide a digital signal processing device that can be built with a smaller circuit scale.

To achieve the above objects, according to the present invention, a digital signal processing device is provided with: adding means; first multiplying means for multiplying a signal by a predetermined multiplication value; delaying means for delaying the output signal of the adding means; and second multiplying means for multiplying the output signal of the delaying means by a predetermined multiplication value. Here, the adding means adds together the output signal of the first multiplying means, the output signal of the delaying means, and the inverted output signal of the second multiplying means. Moreover, the signal is processed by repeating a plurality of times the operation of feeding the output of the adding means to the first multiplying means and to the delaying means. The digital signal processing device is further provided with: storing means for storing the output signal of the adding means; totally adding means; and quantizing means. Here, the operations up to and including the addition operation performed by the adding means constitute one step. In the first step, an input signal from outside is multiplied by the predetermined multiplication value by the first multiplying means and is then fed to the adding means. In the second and following steps, the operation of feeding the output signal of the storing means to the first multiplying means and to the delaying means and the operation of making the adding means add together the output signal of the first multiplying means, the output signal of the delaying means, and the inverted output signal of the second multiplying means are performed in a plurality of steps. Then, in the last step, different values of the output signal of the adding means as stored in different steps in the storing means are totally added together by the totally adding means, then the output signal of the totally adding means is quantized by the quantizing means, and then the output signal of the quantizing means is fed to outside and is simultaneously fed back to the second multiplying means in the first step.

With this configuration, it is possible to perform a multiplication operation by using shared, small-circuit-scale shifters in combination with an adder, and thus without using large-circuit-scale multipliers as conventionally used. This helps greatly reduce the power consumption, and also makes it possible to mount on an LSI the signal processing device that performs operations repeatedly as described above.

In a digital signal processing device according to the present invention, it is preferable to use separate control signals to control whether or not the first multiplying means receives an input signal, whether or not the delaying means outputs a signal, and whether or not the second multiplying means outputs a signal. With this configuration, it is possible to keep inactive whichever means is not currently needed. This helps greatly reduce the power consumption.

In the digital signal processing device described above, the adding means may be adding-and-subtracting means that is also capable of performing subtraction, so that it at least either or both replaces the operation of making the first multiplying means multiply the signal by the predetermined multiplication value with a first operation of multiplying the signal with a predetermined multiplication factor by repeatedly performing calculation operations consisting of making the first multiplying means multiply the signal by a multiplication value equal to a predetermined multiple or the reciprocal thereof and then output the result to the adding-and-subtracting means, then making the adding-and-subtracting means add together or subtract from each other the output of the first multiplying means and the output of the delaying means, and then making the delaying means receive the output of the adding-and-subtracting means, and replaces the operation of making the second multiplying means multiply the signal by the predetermined multiplication value with a second operation of multiplying the signal with a predetermined multiplication factor by repeatedly performing calculation operations consisting of making the second multiplying means multiply the signal by a multiplication value equal to a predetermined multiple or the reciprocal thereof and then output the result to the adding-and-subtracting means, then making the adding-and-subtracting means add together or subtract from each other the output of the second multiplying means and the output of the delaying means, and then making the delaying means receive the output of the adding-and-subtracting means.

By making the adding-and-subtracting means add together or subtract from each other the output of the first or second multiplying means and the output of the delaying means, it is possible to reduce the number of times the operations need to be repeated to fewer than when only addition operations are performed between the output of the first or second multiplying means and the output of the delaying means. For example, in a case where the predetermined multiplication factor is 0.9375 and the multiplication value equal to the predetermined multiple or the reciprocal thereof is $1/16$, addition operations need to be repeated 15 times when only addition operations are used. By contrast, when a subtraction operation is performed with the multiplication value equal to the predetermined multiple or the reciprocal thereof set to 1 for the first time and to $1/16$ for the second time, operations need to be repeated only twice. Thus, even when the accuracy of the multiplication factor is increased, and thus it becomes necessary to process data with a larger number of digits, it is possible to minimize the increase in the calculation clock frequency. Thus, it is possible to increase the accuracy of the multiplication factor while minimizing the power consumption.

Moreover, it is preferable that, every time the calculation operations are repeated, the predetermined multiple or the reciprocal thereof be set to a different value.

This helps reduce the number of repetition of operations. For example, in a case where the predetermined multiplication factor is 0.9375 and the multiplication value equal to the predetermined multiple or the reciprocal thereof is $1/16$, addition operations need to be repeated 15 times when only addition operations are used. By contrast, when the multiplication value equal to the predetermined multiple or the reciprocal thereof is switched from $1/2$ to $1/4$, then to $1/8$, and then to $1/16$ every time the operations are repeated, even if only addition operations are used, it is possible to make the predetermined multiplication factor equal to 0.9375 by repeating addition operations four times. In a case where the predetermined multiplication factor is 0.90625, if subtraction operations are performed with the multiplication value equal to the predetermined multiple or the reciprocal thereof set to 1 for the first time and to $1/32$ for the second and following times, the operations need to be repeated four times to achieve the desired multiplication operation to make the predetermined multiplication factor equal to 0.90625 $(1-1/32-1/32-1/32)$. By contrast, if the multiplication value equal to the predetermined multiple or the reciprocal thereof is switched from 1 to $1/16$ and then to $1/32$ every time the operations are repeated, operations need to be repeated only three times to achieve the desired multiplication operation to make the predetermined multiplication factor equal to 0.90625 $(1-1/16-1/32)$.

Furthermore, it is preferable that, assuming that the predetermined multiplication factor is represented in two-bit notation using "0" and "1", when three or more consecutive digits have "1", the adding-and-subtracting means perform subtraction.

In this way, it is possible to permit the adding-and-subtracting means to perform a subtraction operation only when its doing so helps reduce the number of repetition of operations to fewer than if it performs an addition operation.

To achieve the above objects, according to the present invention, an audio signal reproduction device is provided with: delta-sigma modulation means that receives a PCM signal obtained by subjecting an audio signal to pulse code modulation and that performs delta-sigma modulation on the PCM signal; PWM means that performs pulse width modulation on the signal outputted from the delta-sigma modulation means to produce a one-bit digital signal; and demodulation means that demodulates the one-bit digital signal to an analog signal.

With this configuration, it is possible to digitally amplify a one-bit digital signal first and then demodulate it into an analog signal. This makes it possible to reproduce a sound source with higher fidelity than the conventional multiple-bit PCM system can.

Moreover, the one-bit signal is produced by PWM (for example, 352.8 kHz), which uses a lower sampling frequency than PDM (2.8 MHz or 5.6 MHz). This makes it possible to reduce the switching loss of a switching amplifier, to reduce the power consumption, and to reduce unnecessary electromagnetic radiation. Accordingly, it is no longer necessary to lay shielding against noise as by laying double shielding using a steel plate and a copper plate as is essential with PDM. Thus, it is possible to build products by using plastic cabinets or the like, and thereby to achieve size, weight, and cost reduction.

Moreover, the one-bit digital signal is produced by performing pulse width modulation on a PCM signal that has been subjected to delta-sigma modulation. This makes it possible to dramatically reduce the sampling frequency of delta-sigma modulation as compared with the conventional one-bit system whereby a one-bit digital signal is produced from a PCM signal by the use of a delta-sigma modulation circuit alone. That is, individual operations between clock pulses can be performed with ample margins. Accordingly, it is possible to further divide an operation that is performed with a single clock into operations that are performed separately. Specifically, to perform an operation with the operation divided into n steps, it can be performed by using a clock having n times the frequency. Moreover, as described above, the sampling frequency of the delta-sigma modulation circuit has been reduced dramatically, even with n=6 or 7, none of the effects described above is lost. Furthermore, the n steps mentioned above are basically of the same kind, such as an integration operation, with a different constant used in each step. Thus, desired delta-sigma modulation can be achieved simply by making it possible to perform the basic operation and to switch constants. This helps greatly simplify the configuration in terms of both software and hardware. That is, it is possible to further suppress noise and thereby reduce unnecessary electromagnetic operation.

In the configuration described above, it is advisable to use, as the delta-sigma modulation means mentioned above, the digital signal processing device described earlier. This helps greatly reduce the power consumption.

Moreover, in the configuration described above, the delta-sigma modulation means may alternately process the left-channel and right-channel signals of the audio signal. This permits the multiplying means, adding means, and quantizing means to be shared between the left and right channels. This helps further reduce the circuit scale, and thus leads to a further reduction of the power consumption.

Moreover, any of the audio signal reproduction devices configured as described above may be a portable audio signal reproduction device. This makes it possible to achieve low power consumption, compactness and light weight, and low cost in portable audio signal reproduction devices, in which low power consumption, compactness and light weight, and low cost are eagerly sought,

BEST MODE FOR CARRYING OUT THE INVENTION

Figure 1:
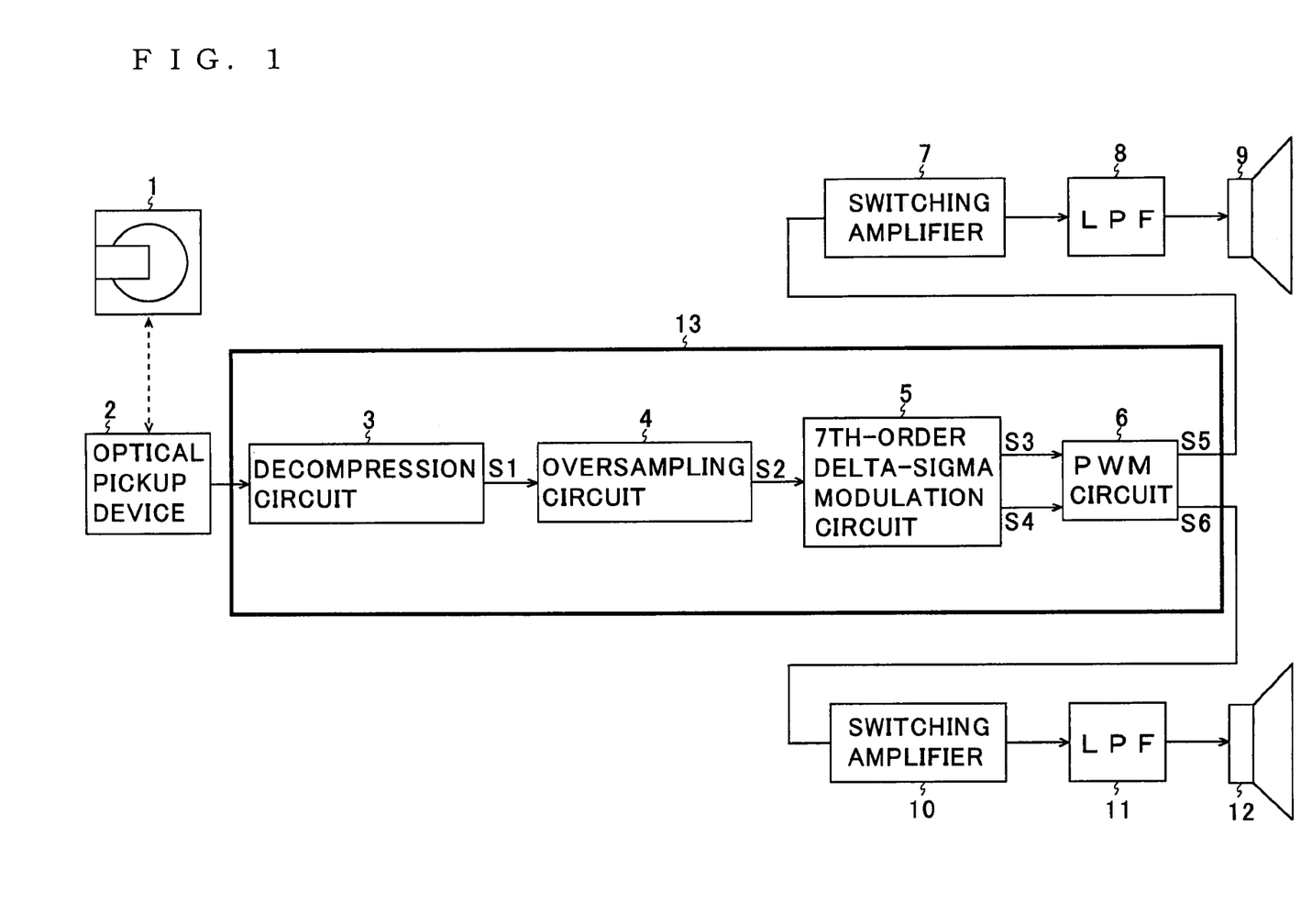
FIG. 1 is a diagram showing an example of the configuration of an MD reproduction device according to the invention.

Hereinafter, an embodiment of the present invention will be described with reference to the accompanying drawings. Here, a description will be given of an MD reproduction device as an example of an audio signal reproduction device according to the invention. FIG. 1 is a block diagram showing an example of the configuration of the MD reproduction device according to the invention.

An optical pickup device 2 extracts a signal from an MD 1, and feeds the signal to a decompression circuit 3. The decompression circuit 3 decompresses the signal (compressed music data) fed thereto. Thus, the signal outputted from the decompression circuit 3 is a PCM signal S1 having a sampling frequency of 44.1 kHz.

An oversampling circuit 4 converts the PCM signal S1 outputted from the decompression circuit 3 into a 24-bit (multiple-bit) PCM signal S2 having a sampling frequency of 8 fs. Here, fs=44.1 kHz.

A seventh-order delta-sigma demodulation circuit 5 performs delta-sigma modulation on the PCM signal S2 outputted from the oversampling circuit 4 to produce a left-channel six-bit PCM signal S3 and a right-channel six-bit PCM signal S4. The six-bit PCM signals S3 and S4 each have a sampling frequency of 8 fs.

A PWM circuit 6 performs pulse width modulation on the left-channel six-bit PCM signal S3 outputted from the seventh-order delta-sigma demodulation circuit 5 to produce a left-channel one-bit PWM signal S5, and performs pulse width modulation on the right-channel six-bit PCM signal S4 outputted from the seventh-order delta-sigma demodulation circuit 5 to produce a right-channel one-bit PWM signal S6.

The left-channel one-bit PWM signal S5 outputted from the PWM circuit 6 is converted into an analog signal and amplified by a switching amplifier 7, then has high-frequency components eliminated therefrom by a low-pass filter (LPF) 8, and is reproduced as sound by a left-channel loudspeaker 9. The right-channel one-bit PWM signal S6 outputted from the PWM circuit 6 is converted into an analog signal and amplified by a switching amplifier 10, then has high-frequency components eliminated therefrom by a low-pass filter (LPF) 11, and is reproduced as sound by a right-channel loudspeaker 12.

In this embodiment, the decompression circuit 3, oversampling circuit 4, seventh-order delta-sigma demodulation circuit 5, and PWM circuit 6 are mounted on a single system LSI. It is, however, also possible to provide them separately.

Figure 2:
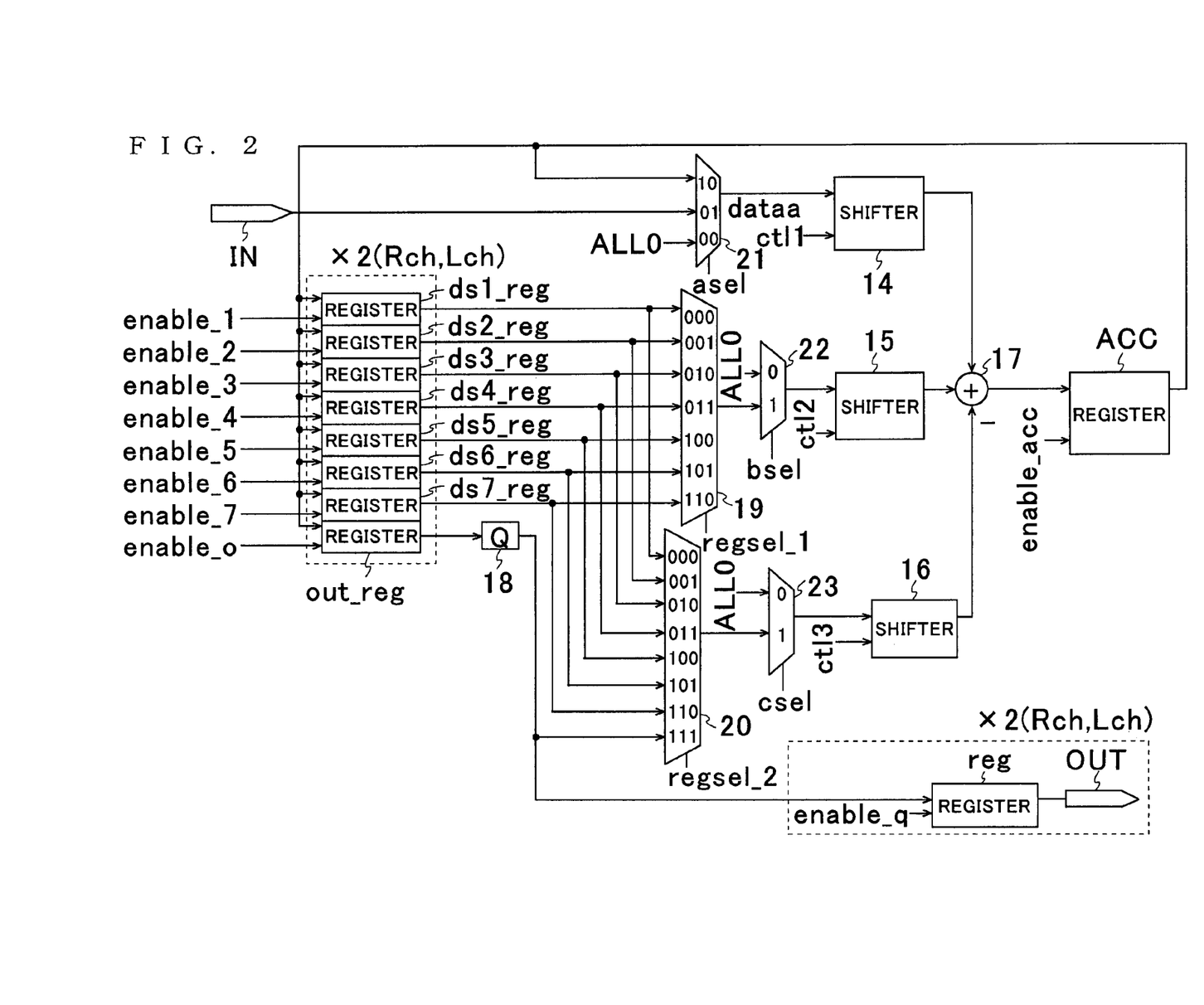
FIG. 2 is a diagram showing an example of the configuration of the seventh-order delta-sigma modulation circuit provided in the MD reproduction device of FIG. 1.

The distinctive features of the invention lie in the seventh-order delta-sigma demodulation circuit 5 and the PWM circuit 6. Now, the configuration of these will be described in detail. First, a description will be given of the seventh-order delta-sigma demodulation circuit 5. FIG. 2 shows an example of the configuration of the seventh-order delta-sigma demodulation circuit 5.

The seventh-order delta-sigma modulation circuit is built as a digital signal processing device composed of an input terminal IN, an output terminal OUT, shifters 14 to 16, an adder 17, a quantizer 18, registers ds1_reg to ds7_reg, out_reg, ACC, and reg, and selectors 19 to 23.

The input terminal IN is connected to the "01" input terminal of the selector 21, and the output terminal of the selector 21 is connected to the input side of the shifter 14. The adder 17 receives the outputs of the shifters 14 and 15 on a non-inverting basis, and receives the output of the shifter 16 on an inverting basis. The output side of the adder 17 is connected to the input side of the register ACC. The output side of the register ACC is connected to the "10" input terminal of the selector 21 and to the input side of each of the registers ds1_reg to ds7_reg and out_reg.

The output side of the register ds1_reg is connected to the "000" input terminal of each of the selectors 19 and 20. The output side of the register ds2_reg is connected to the "001" input terminal of each of the selectors 19 and 20. The output side of the register ds3_reg is connected to the "010" input terminal of each of the selectors 19 and 20. The output side of the register ds4_reg is connected to the "011" input terminal of each of the selectors 19 and 20. The output side of the register ds5_reg is connected to the "100" input terminal of each of the selectors 19 and 20. The output side of the register ds6_reg is connected to the "101" input terminal of each of the selectors 19 and 20. The output side of the register ds7_reg is connected to the "110" input terminal of each of the selectors 19 and 20. The output side of the register out_reg is connected to the input side of the quantizer 18, and the output side of the quantizer 18 is connected to the "111" input terminal of the selector 20 and to the input side of the register reg. The output side of the register reg is connected to the output terminal OUT.

The output terminal of the selector 19 is connected to the "1" input terminal of the selector 22, and the output terminal of the selector 22 is connected to the input side of the shifter 15. The output terminal of the selector 20 is connected to the "1" input terminal of the selector 23, and the output terminal of the selector 23 is connected to the input side of the shifter 16.

The shifters 14 to 16 are controlled by shifter control signals ctl1 to ctl3, respectively. The selector 19 is controlled by a selection signal regsel_1. The selector 20 is controlled by a selection signal regsel_2. The selector 21 is controlled by a selection signal asel. The selector 22 is controlled by a selection signal bsel. The selector 23 is controlled by a selection signal csel. The selectors 19 to 23 each select one of the input terminals thereof that corresponds to the state of the selection signal fed thereto, and output to the output terminal thereof the signal fed to the selected input terminal. The register ACC is controlled by an enable signal enable-_acc. The resisters ds1_reg to ds7_reg are controlled by enable signals enable_1 to enable_7, respectively. The register out_reg is controlled by an enable signal enable_o. To each of the "00" input terminal of the selector 21, the "0" input terminal of the selector 22, and the "0" input terminal of the selector 23 is fed data consisting of a bit string of which all the bits are zero.

In this configuration, when a multiplication operation is performed, the selection signal asel for the selector 21, the selection signal bsel for the selector 22, and the selection signal csel for the selector 23 are switched to signals for a multiplication operation, so that the combined operation of the shifters 14, 15, and 16 and the adder 17 yields the result of the multiplication operation.

For example, the same result as that obtained in the PDM signal generation circuit shown in FIG. 5 as a result of the multiplier 101 performing a multiplication operation on a 358.8 kHz 24-bit PCM signal fed in via the input terminal IN can be obtained in the seventh-order delta-sigma modulation circuit shown in FIG. 2 in the following manner. When the multiplication factor m1=0.5, in the seventh-order delta-sigma modulation circuit shown in FIG. 2, the selection signal asel for the selector 21 is set to "01", and the output data dataa of the selector 21 received by the shifter 14 is shifted one bit rightward by the shifter 14. When the multiplication factor m1=0.25, in the seventh-order delta-sigma modulation circuit shown in FIG. 2, the selection signal asel for the selector 21 is set to "01", and the output data dataa of the selector 21 received by the shifter 14 is shifted two bits rightward by the shifter 14. Moreover, in either case, the selection signals bsel and csel are set to "0", so that the output value of the shifter 14 is stored in the register ACC.

Figure 6:
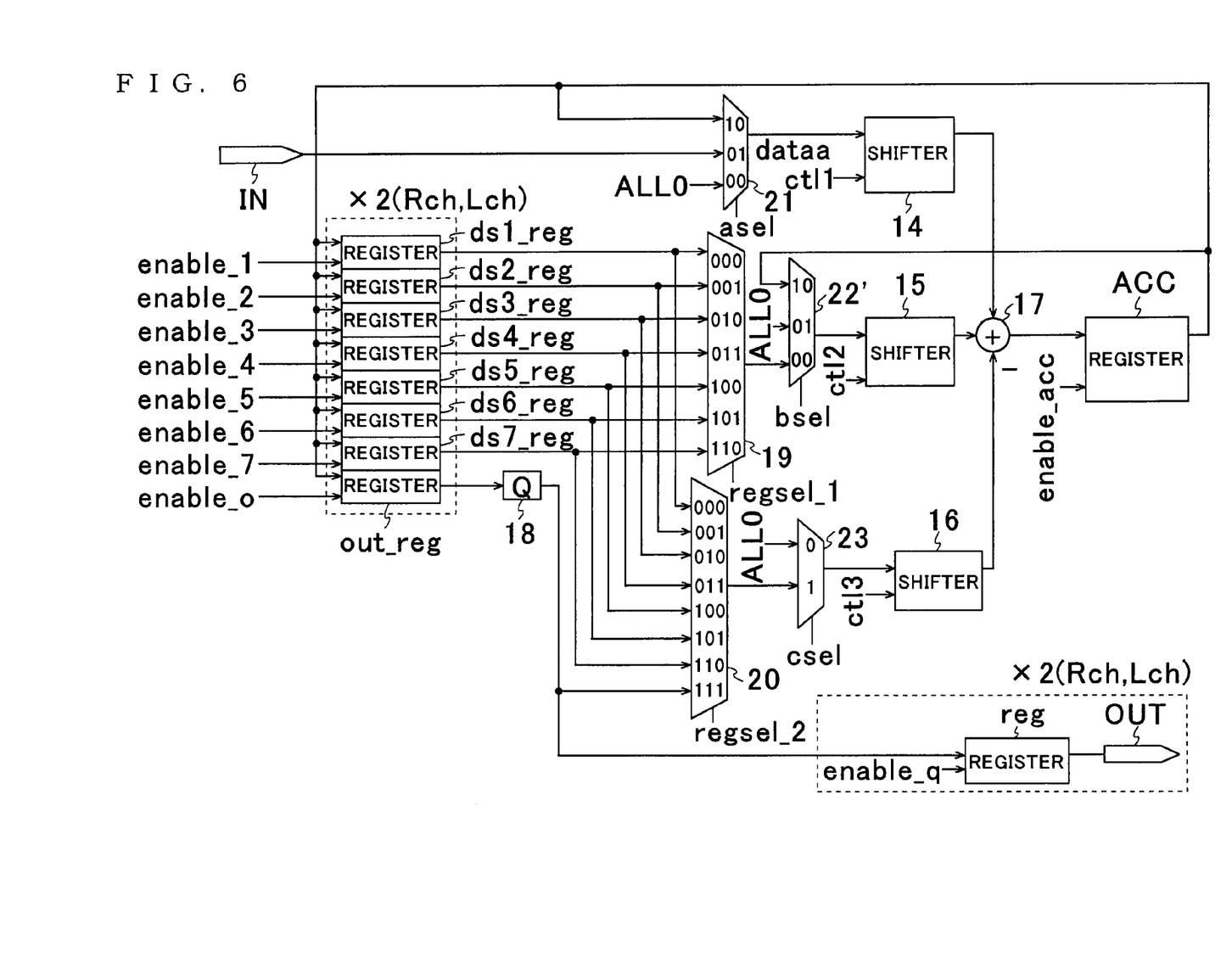
FIG. 6 is a diagram showing another example of the configuration of the seventh-order delta-sigma modulation circuit provided in the MD reproduction device of FIG. 1.

Incidentally, better sound quality can be obtained by increasing the accuracy of the multiplication factor m1. This can be achieved by adding together, as necessary, differently shifted shifter values. For example, the multiplication factor m1 can be set to 0.9375 in the following manner. In this case, the seventh-order delta-sigma demodulation circuit 5 is given, instead of the circuit configuration shown in FIG. 2, a circuit configuration as shown in FIG. 6. In FIG. 6, such elements and signals as are found also in FIG. 2 are identified with the same reference numerals and symbols, and their detailed explanations will be omitted. In the seventh-order delta-sigma demodulation circuit shown in FIG. 6, the selector 22 used in the seventh-order delta-sigma demodulation circuit shown in FIG. 2 is replaced with a selector 22'. Correspondingly, the output side of the register ACC is connected to the "10" input terminal of the selector 22', the output terminal of the selector 19 is connected to the "00" input terminal of the selector 22', and the output terminal of the selector 22' is connected to the input side of the shifter 15. To the "01" input terminal of the selector 22' is fed data consisting of a bit string of which all the bits are zero. The selector 22' is controlled by the selection signal bsel so that the selector 22' selects one of the input terminals thereof that corresponds to the state of the selection signal and outputs to the output terminal thereof the signal fed to the selected input terminal. Here, depending on an external signal (not illustrated), the adder 17 can receive the output of the shifter 14 not only on a non-inverting basis but also on an inverting basis.

First, in the seventh-order delta-sigma modulation circuit shown in FIG. 6, the selection signal asel for the selector 21 is set to "01", and the output data dataa of the selector 21 received by the shifter 14 is shifted one bit rightward by the shifter 14. Moreover, the selection signal bsel is set to "01", and the selection signal csel is set to "0", so that the output value of the shifter 14 is stored in the register ACC.

Then, the selection signal asel for the selector 21 is set to "0l", and the output data dataa of the selector 21 received by the shifter 14 is shifted two bits rightward by the shifter 14. Moreover, the selection signal bsel is set to "10", and the selection signal csel is set to "0", so that the sum of the output values of the shifters 14 and 15 is stored in the register ACC. At this time point, the multiplication factor m1 is equal to 0.75 (=½+¼).

Furthermore, the selection signal asel for the selector 21 is set to "01", and the output data dataa of the selector 21 received by the shifter 14 is shifted three bits rightward by the shifter 14. Moreover, the selection signal bsel is set to "10", and the selection signal csel is set to "0", so that the sum of the output values of the shifters 14 and 15 is stored in the register ACC. At this time point, the multiplication factor m1 is equal to 0.875 (=½+¼+⅛).

Furthermore, the selection signal asel for the selector 21 is set to "01", and the output data dataa of the selector 21 received by the shifter 14 is shifted fourth bits rightward by the shifter 14. Moreover, the selection signal bsel is set to "10", and the selection signal csel is set to "0", so that the sum of the output values of the shifters 14 and 15 is stored in the register ACC. At this time point, the multiplication factor m1 is equal to 0.9375 (=½+¼+⅛+ 1/16).

By shifting the signal a plurality of times with the shifter 14 in this way, it is possible to increase the accuracy of the multiplication factor. The procedure described above (hereinafter referred to also as the first procedure) requires four addition operations to make the multiplication factor m1 equal to 0.9375. With the seventh-order delta-sigma demodulation circuit 5 shown in FIG. 6, it is possible to increase the accuracy of the multiplication factor also through the following procedure (hereinafter referred to also as the second procedure).

Consider a case where, as in the example described above, the multiplication factor m1 is made equal to 0.9375. In the seventh-order delta-sigma demodulation circuit shown in FIG. 6, first, the selection signal asel for the selector 21 is set to "01", but, here, the output data dataa of the selector 21 received by the shifter 14 is not shifted. Then, the selection signal bsel is set to "01" and the selection signal csel is set to "0", so that the output value of the shifter 14 is stored in the register ACC.

Now, the adder 17 is so switched that it receives the output of the shifter 14 not on a non-inverting basis but on an inverting basis. Then, the selection signal asel for the selector 21 is set to "01", and the output data dataa of the selector 21 received by the shifter 14 is shifted four bits rightward by the shifter 14. Moreover, the selection signal bsel is set to "10", and the selection signal csel is set to "0". As a result, the sum of the output of the shifter 15 and the output of the shifter 14, here inverted so as to be subtracted from the output of the shifter 15, is stored in the register ACC. At this time point, the multiplication factor m1 is already equal to 0.9375 (1−1/16). This procedure requires only two addition or subtraction operations, and thus requires fewer operations than when the necessary calculations are performed only as addition operations. With this procedure, even when the accuracy of the multiplication factor is increased, and thus it becomes necessary to process data with a larger number of digits, it is possible to minimize the increase in the calculation clock frequency. Thus, it is possible to increase the accuracy of the multiplication factor while minimizing the power consumption.

For maximum effect, whether to make the seventh-order delta-sigma demodulation circuit 5 shown in FIG. 6 perform the first or second procedure is determined in the following manner. If a given fixed factor, when represented in binary notation and unfolded as a sequence of addition operations, includes three or more consecutive digits having "1", the second procedure is adopted. In the example described above where the multiplication factor m1 is made equal to 0.9375, the factor can be represented as m1=0.1111=(½)+(¼)+(⅛)+(1/16) in binary notation, and this, when a subtraction operation is used, can be processed as m1=0.1111=(1)−(1/16).

The value obtained by multiplying the input signal stored in the register ACC by the multiplication factor m1 is then stored in the registers ds1_reg to ds7_reg and out_reg, which correspond respectively to the delay elements 121 to 128 of different orders in FIG. 5. The registers ds1_reg to ds7_reg and out_reg are each 24-bit wide.

When the selection signal asel for the selector 21 is "10", the output of the register ACC (which is equal to the register value of the register ds1_reg) is used as the output of the selector 21. This output of the selector 21 is shifted by the shifter 14 so as to be multiplied by a value corresponding to a multiplication factor m2, and is then fed to the adder 17 as one non-inverting input thereto. When the selection signal bsel is "1" and in addition the selection signal regsel_1 is "001", the previous register value of the register ds2_reg is used as the output of the selector 22. This output of the selector 22 is, without being shifted for multiplication by the shifter 15, fed to the adder 17 as the other non-inverting input thereto. When the selection signal csel is "1" and in addition the selection signal regsel_2 is "010", the previous register value of the register ds3_reg is used as the output of the selector 23. This output of the selector 23 is shifted by the shifter 16 so as to be multiplied by a value corresponding to a multiplication factor m8, and is then fed to the adder 17 as the inverting input thereto. In this case, the adder 17 operates in an equivalent manner to the adder 113 provided in the PDM signal generating circuit in FIG. 5.

By varying the selection signals for the selectors 19 to 23 and the control signals for the shifters 14 to 16, it is possible to make the adder 17 operate in an equivalent manner to any of the adders 114 to 118 provided in the PDM signal generating circuit in FIG. 5.

In this way, the operations that need to be performed to obtain data of each order can be performed with a single clock pulse. Thus, in an nth-order noise shaper (delta-sigma modulation circuit), the data of all the orders can be obtained with n clock pulses at the minimum.

The seventh-order delta-sigma modulation circuit shown in FIG. 2 or 6 does not require the multiplies 101 to 111 provided in the PDM signal generating circuit in FIG. 5. This helps reduce the circuit scale. Moreover, it is easy to increase the number of orders of delta-sigma modulation. This makes it possible to obtain excellent noise characteristics. Furthermore, it is possible to permit the input signal to have a very low sampling frequency.

Advisably, the frequency of the main clock is calculated from the total number of operation steps, and an address counter is created that is needed in a ROM (not illustrated) provided in the seventh-order delta-sigma modulation circuit shown in FIG. 2 or 6.

In a case where 24 steps are needed for each of the left and right channels during a period of 8 fs, it is necessary to use a clock having a frequency of 8 fs×(24 steps×2 channels) =384 fs (16.8688 MHz). Thus, the individual registers receive this clock or a signal having a phase deviated therefrom. A 24-count counter (not illustrated) is provided in the seventh-order delta-sigma modulation circuit shown in FIG. 2 or 6, and the count value of this 24-count counter is used as the address in the above-mentioned ROM. In this ROM are stored the enable signals enable_1 to enable_7, enable_0, and enable_q for the registers, the selection signals asel, bsel, csel, regsel_1, and regsel_2 for the selectors, and the control signals ctl1 to ctl3 for controlling the number of digits by which the shifters shift the data fed thereto. The values of these signals as actually outputted with every clock pulse are varied from one clock pulse to another. The shifters 14 to 16, adder 17, and quantizer 18 are used alternately for the left and right channels (for example, when the 8 fs signal is "1", for the left channel and, when it is "0", for the right channel). This helps greatly reduce the circuit scale. It should be noted that, with respect to the registers ds1_reg to ds7_reg, out_reg, and reg and the output terminal OUT, there are provided two sets of them separately, one for the left channel and the other for the right channel.

The data stored as the register values of the registers ds1_reg, ds2_reg, ds3_reg, ds4_reg, ds5_reg, ds6_reg, to ds7_reg, and out_reg (each 24-bit wide, and for each of the left and right channels) in the seventh-order delta-sigma modulation circuit shown in FIG. 2 or 6 corresponds respectively to ds1, ds2, ds3, ds4, ds5, ds6, ds7, and out in the PDM signal generation circuit in FIG. 5.

There exist enable signals one for each of the registers ds1_reg to ds7_reg and out_reg, which thus each become active only once during a period of 8 fs to store data. That is, these registers do not operate every 384 fs (=16.8688 MHz), and thus exert no effect on the power consumption.

As described above, a multiplication operation can be achieved by the combined operation of the shifters 14 to 16 and the adder 17. The multiplication factor is set according to the ultimately desired characteristics. The 24-bit data ultimately stored in the register out_reg is divided into 47 sections by the quantizer 18, and is thereby replaced with six-bit data (in the embodiment under discussion, each section being one of the 47 values in total, namely "000000" to "101110"). In this way, the PCM signal fed in via the input terminal IN is subjected to delta-sigma modulation, and is thereby converted into a PCM signal with a smaller number of bits. This PCM signal with a smaller number of bits is then, by way of the register reg, fed out via the output terminal OUT.

Figure 3:
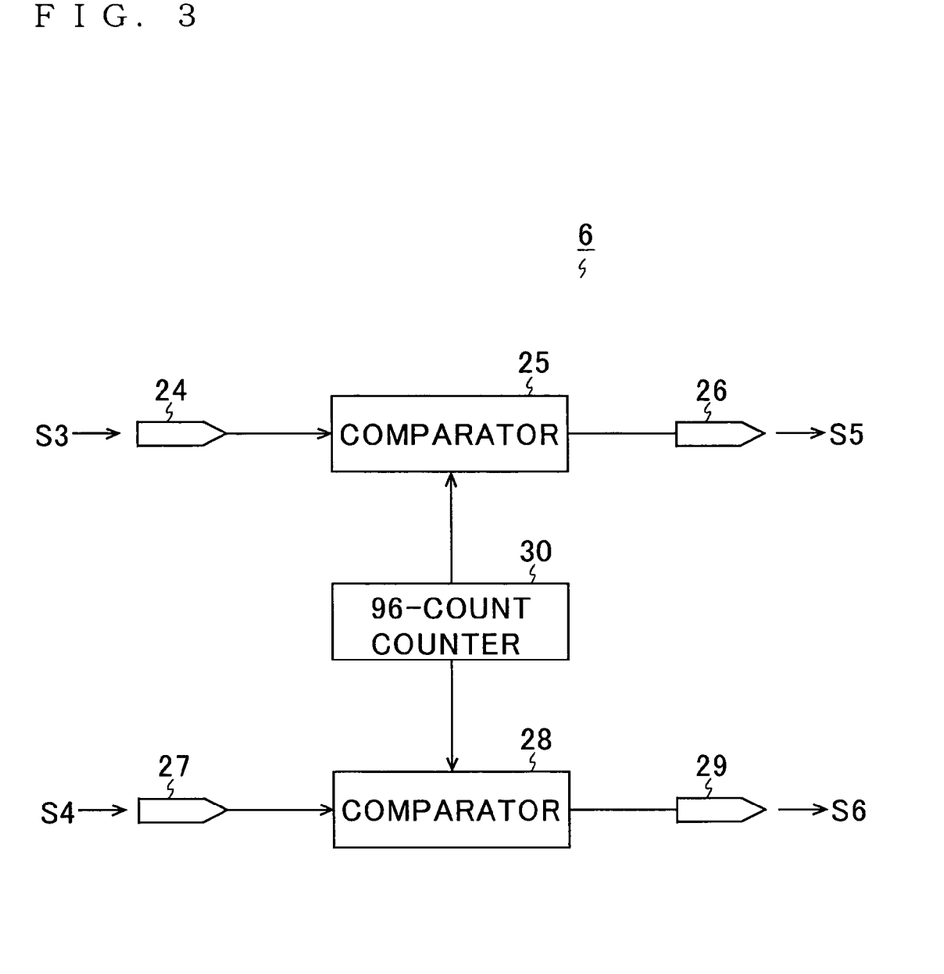
FIG. 3 is a diagram showing an example of the configuration of the PWM circuit provided in the MD reproduction device of FIG. 1.

Next, a description will be given of the PWM circuit 6. FIG. 3 shows an example of the configuration of the PWM circuit 6. The PWM circuit 6 shown in FIG. 3 is composed of input terminals 24 and 27, comparators 25 and 28, output terminals 26 and 29, and a 96-count counter 30.

Via the input terminal 24 is fed in the left-channel six-bit PCM signal S3 outputted from the seventh-order delta-sigma demodulation circuit shown in FIG. 2 or 6. The comparator 25 compares the left-channel six-bit PCM signal S3 fed in via the input terminal 24 with the count value of the 96-count counter 30 to produce the left-channel PWM signal S5, and then feeds this to the output terminal 26. On the other hand, via the input terminal 27 is fed in the right-channel six-bit PCM signal S4 outputted from the seventh-order delta-sigma demodulation circuit shown in FIG. 2 or 6. The comparator 28 compares the right-channel six-bit PCM signal S4 fed in via the input terminal 27 with the count value of the 96-count counter 30 to produce the right-channel PWM signal S6, and then feeds this to the output terminal 29. The 96-count counter 30 counts 96 values during a period of 8 fs.

Figure 4:
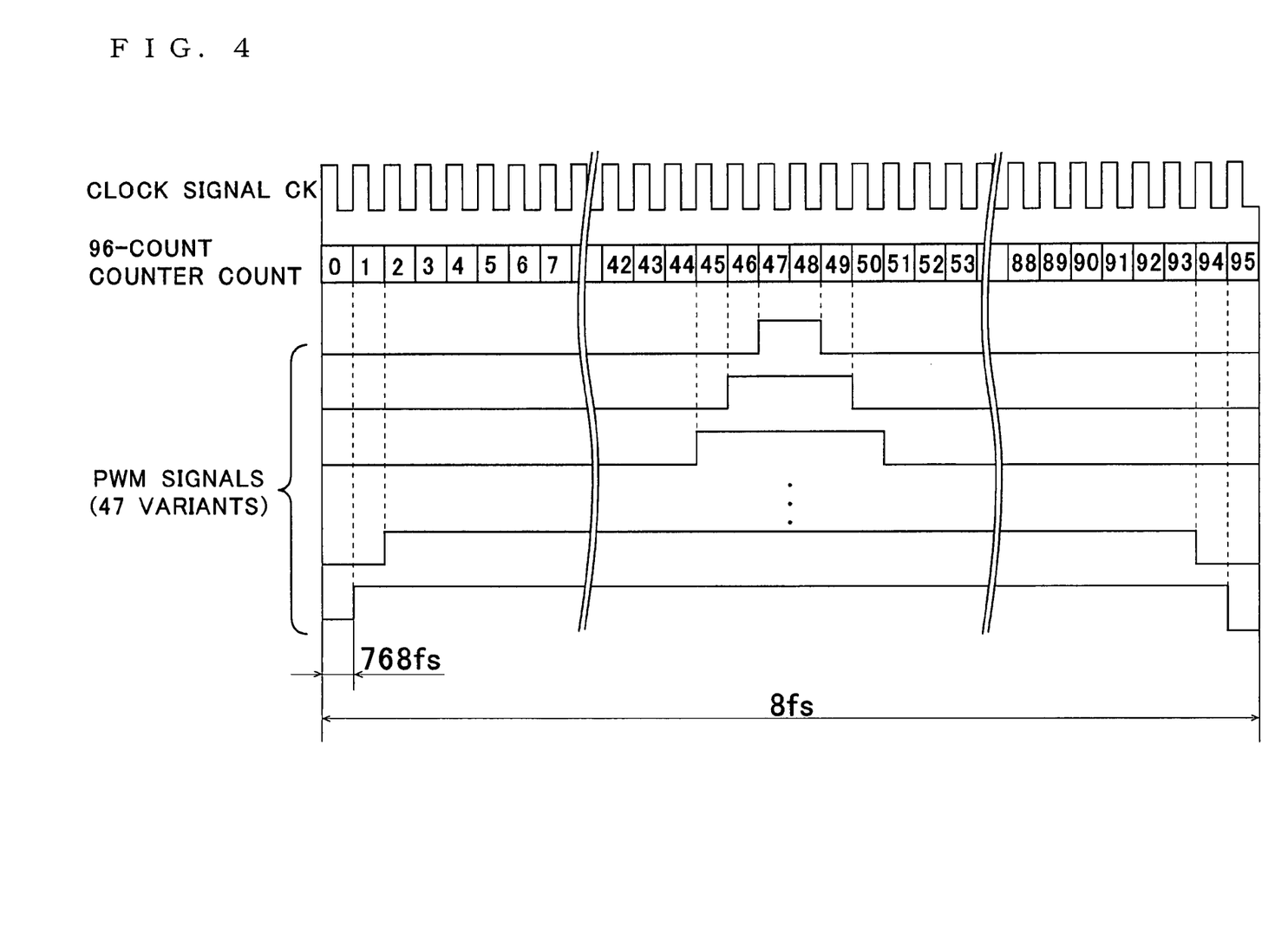
FIG. 4 is a diagram showing the relationship between the clock signal of the 96-count counter, the count value of the 96-count counter, and the PWM signals.

The left-channel PWM signal S5 produced by the comparator 25 toggles to a high level when the decimal value corresponding to the left-channel six-bit PCM signal S3 becomes equal to the count value of the 96-count counter 30, and toggles to a low level when the sum of the decimal value corresponding to the left-channel six-bit PCM signal S3 and the count value of the 96-count counter 30 becomes equal to 95. On the other hand, the right-channel PWM signal S6 produced by the comparator 28 toggles to a high level when the decimal value corresponding to the right-channel six-bit PCM signal S4 becomes equal to the count value of the 96-count counter 30, and toggles to a low level when the sum of the decimal value corresponding to the right-channel six-bit PCM signal S4 and the count value of the 96-count counter 30 becomes equal to 95. The purpose of the comparators 25 and 28 operating in this way is to permit the left-channel and right-channel PWM signals S5 and S6 to always toggle twice each during a period of 8 fs without being fixed at a high or low level. FIG. 4 shows the relationship here between the clock signal CK of the 96-count counter 30, the count value of the 96-count counter 30, and the PWM signals.

The left-channel and right-channel PWM signals S5 and S6 are pulse signals of fixed amplitude and fixed pulse occurrence rate, and represent signal levels by varying the pulse width along the time axis. Thus, the left-channel and right-channel PWM signals S5 and S6 are each one-bit wide in the amplitude direction, but have multiple values in the time axis direction. As shown in FIG. 4, data conversion of 47 values into different patterns within one period of 8 fs (=352.8 kHz) is achieved by varying, from one value to the next, the width of the high level period by 768 fs (=33.8688 MHz) symmetrically, i.e., on each of the left and right sides of the pulse.

In this embodiment, a seventh-order delta-sigma modulation circuit is used as the delta-sigma modulation circuit. It is, however, also possible to use a delta-sigma modulation circuit of any other order.

INDUSTRIAL APPLICABILITY

Digital signal processing devices and audio signal reproduction devices according to the present invention find wide application in various devices, such as audio appliances, that process digital signals.

The invention claimed is:

1. A digital signal processing device comprising:
   adding means;
   first multiplying means for multiplying a signal by a predetermined multiplication value;
   delaying means for delaying an output signal of the adding means; and
   second multiplying means for multiplying an output signal of the delaying means by a predetermined multiplication value,
   wherein the adding means adds together an output signal of the first multiplying means, the output signal of the delaying means, and an inverted output signal of the second multiplying means, and
   wherein the signal is processed by repeating a plurality of times an operation of feeding the output of the adding means to the first multiplying means and to the delaying means.

2. The digital signal processing device of claim 1, further comprising:
   storing means for storing the output signal of the adding means;
   totally adding means; and
   quantizing means,
   wherein operations up to and including an addition operation performed by the adding means constitute one step,
   wherein, in a first step, an input signal from outside is multiplied by the predetermined multiplication value by the first multiplying means and is then fed to the adding means,
   wherein, in second and following steps, an operation of feeding an output signal of the storing means to the first multiplying means and to the delaying means and an operation of making the adding means add together the output signal of the first multiplying means, the output signal of the delaying means, and the inverted output signal of the second multiplying means are performed in a plurality of steps, and
   wherein, in a last step, different values of the output signal of the adding means as stored in different steps in the storing means are totally added together by the totally adding means, then an output signal of the totally adding means is quantized by the quantizing means, and then an output signal of the quantizing means is fed to outside and is simultaneously fed back to the second multiplying means in the first step.

3. The digital signal processing device of claim 2, further comprising:
controlling means for controlling which step the delaying means outputs a signal of.

4. The digital signal processing device of one of claims 2 and 3, further comprising:
second controlling means for controlling which step the second multiplying means outputs a signal of.

5. The digital signal processing device of one of claims 1 to 3, further comprising:
third controlling means for controlling whether the first multiplying means receives the input signal from outside, receives the output signal of the adding means, or receives no signal.

6. The digital signal processing device of one of claims 1 to 3, further comprising:
fourth controlling means for controlling whether or not the delaying means outputs a signal.

7. The digital signal processing device of one of claims 1 to 3, further comprising:
fifth controlling means for controlling whether or not the second multiplying means outputs a signal.

8. The digital signal processing device of claim 1,
wherein the adding means is adding-and-subtracting means that is also capable of performing subtraction, and at least either or both
replaces the operation of making the first multiplying means multiply the signal by the predetermined multiplication value with a first operation of multiplying the signal with a predetermined multiplication factor by repeatedly performing calculation operations consisting of making the first multiplying means multiply the signal by a multiplication value equal to a predetermined multiple or a reciprocal thereof and then output a result to the adding-and-subtracting means, then making the adding-and-subtracting means add together or subtract from each other the output of the first multiplying means and the output of the delaying means, and then making the delaying means receive an output of the adding-and-subtracting means and
replaces the operation of making the second multiplying means multiply the signal by the predetermined multiplication value with a second operation of multiplying the signal with a predetermined multiplication factor by repeatedly performing calculation operations consisting of making the second multiplying means multiply the signal by a multiplication value equal to a predetermined multiple or a reciprocal thereof and then output a result to the adding-and-subtracting means, then making the adding-and-subtracting means add together or subtract from each other the output of the second multiplying means and the output of the delaying means, and then making the delaying means receive an output of the adding-and-subtracting means.

9. The digital signal processing device of claim 8,
wherein, every time the calculation operations are repeated, the predetermined multiple or the reciprocal thereof is set to a different value.

10. The digital signal processing device of one of claims 8 and 9,
wherein, assuming that the predetermined multiplication factor is represented in two-bit notation using "0" and "1", when three or more consecutive digits have "1", the adding-and-subtracting means performs subtraction.

11. An audio signal reproduction device, comprising:
delta-sigma modulation means that performs delta-sigma modulation on a signal inputted thereto;
PWM means that performs pulse width modulation on a signal outputted from the delta-sigma modulation means to produce a one-bit digital signal; and
demodulation means that demodulates the one-bit digital signal to an analog signal,
wherein the delta-sigma modulation means is a digital signal processing device of claim 1.

12. The audio signal reproduction device of claim 11,
wherein the signal inputted to the delta-sigma modulation means has left-channel and right-channel signals of an audio signal, and
wherein the delta-sigma modulation means alternately processes left-channel and right-channel signals.

13. The audio signal reproduction device of claim 11 or 12,
wherein the audio signal reproduction device is a portable audio signal reproduction device.

* * * * *